(12) United States Patent
Pirk et al.

(10) Patent No.: US 8,993,356 B2
(45) Date of Patent: Mar. 31, 2015

(54) METHOD FOR CONSTRUCTING AN ELECTRICAL CIRCUIT, AND ELECTRICAL CIRCUIT

(75) Inventors: Tjalf Pirk, Stuttgart (DE); Juergen Butz, Reutlingen (DE); Axel Franke, Ditzingen (DE); Frieder Haag, Wannweil (DE); Heribert Weber, Nuertingen (DE); Arnim Hoechst, Reutlingen (DE); Sonja Knies, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 499 days.

(21) Appl. No.: 13/232,088

(22) Filed: Sep. 14, 2011

(65) Prior Publication Data
US 2012/0061860 A1  Mar. 15, 2012

(30) Foreign Application Priority Data
Sep. 14, 2010 (DE) .......................... 10 2010 040 704

(51) Int. Cl.
*H01L 21/00* (2006.01)
*H01L 23/31* (2006.01)
*H01L 21/56* (2006.01)
*H01L 23/58* (2006.01)
*H01M 6/40* (2006.01)
*H01M 10/04* (2006.01)
*H01M 10/0525* (2010.01)
*H01L 23/00* (2006.01)
*H01L 23/538* (2006.01)
*H01L 25/065* (2006.01)

(52) U.S. Cl.
CPC .......... *H01L 23/3121* (2013.01); *H01L 21/561* (2013.01); *H01L 21/568* (2013.01); *H01L 23/58* (2013.01); *H01M 6/40* (2013.01); *H01M 10/0436* (2013.01); *H01M 10/0525* (2013.01); *H01L 24/24* (2013.01); *H01L 24/96* (2013.01); *H01L 23/5389* (2013.01); *H01L 25/0655* (2013.01); *Y02E 60/122* (2013.01); *H01L 2224/24137* (2013.01); *H01L 2924/10253* (2013.01)
USPC ............... 438/19; 257/E21.502; 257/E23.116

(58) Field of Classification Search
CPC ...................................................... H01L 23/58
USPC ...................... 438/19; 257/E21.502, E23.116
See application file for complete search history.

(56) References Cited

U.S. PATENT DOCUMENTS

| | | | |
|---|---|---|---|
| 3,579,056 A | 5/1971 | TeVelde et al. | |
| 5,161,304 A * | 11/1992 | Queyssac et al. | 29/827 |
| 2003/0020165 A1 * | 1/2003 | Matsumoto | 257/751 |
| 2011/0193238 A1 * | 8/2011 | Ahn et al. | 257/773 |
| 2014/0124901 A1 * | 5/2014 | Lee et al. | 257/621 |

OTHER PUBLICATIONS

Bates et al., Thin-film rechargeable lithium batteries, Journal of Power Sources, Mar. 1995, pp. 58-62, vol. 54 Issue 1, Elsevier, Journal of Power Sources, Oak Ridge National Laboratory, Oak Ridge, TN, U.S.A. (5 pages).

* cited by examiner

*Primary Examiner* — Thien F Tran
(74) *Attorney, Agent, or Firm* — Maginot, Moore & Beck LLP

(57) ABSTRACT

A method for constructing an electrical circuit that includes at least one semiconductor chip encapsulated with a potting compound is disclosed. The method includes applying a galvanic layer arrangement for forming an electrochemical element on an element of the electrical circuit including the at least one semiconductor chip.

13 Claims, 4 Drawing Sheets

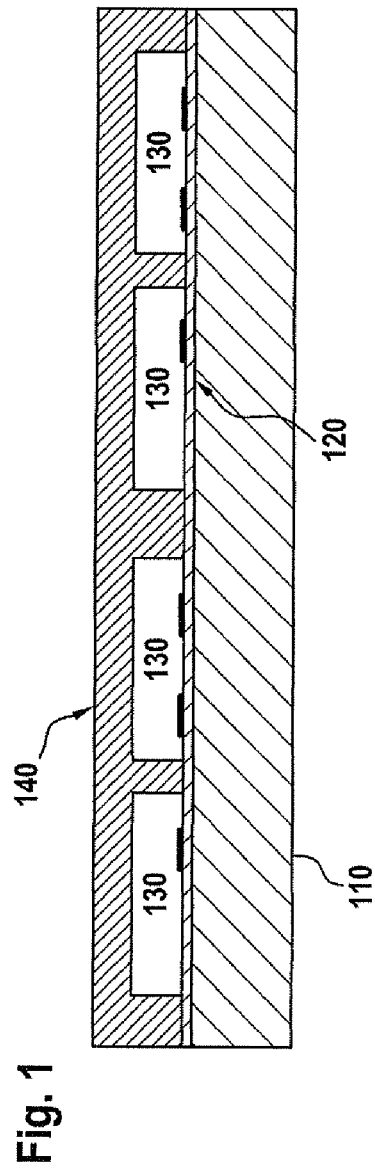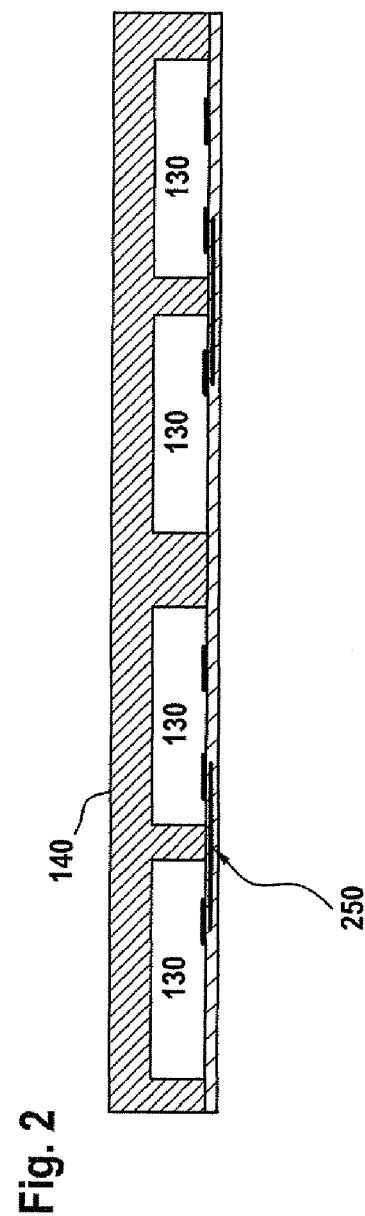

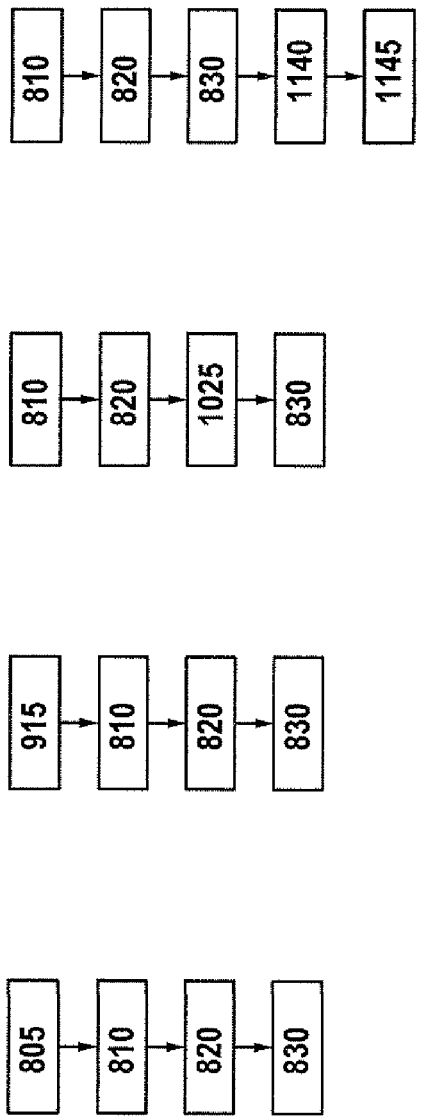

METHOD FOR CONSTRUCTING AN ELECTRICAL CIRCUIT, AND ELECTRICAL CIRCUIT

This application claims priority under 35 U.S.C. §119 to German patent application no. DE 10 2010 040 704.6, filed Sep. 14, 2010 in Germany, the disclosure of which is incorporated herein by reference in its entirety.

BACKGROUND

The present disclosure relates to a method for constructing an electrical circuit comprising at least one semiconductor chip, to an electrical circuit comprising at least one semiconductor chip, and to a sensor module comprising the electrical circuit.

So-called wafer level packaging is used in chip construction and connection technology. In this case, the individual packaging processes are carried out on the silicon wafer or on an arrangement in the wafer format.

U.S. Pat. No. 3,579,056 A1 describes a method for producing a semiconductor device, wherein semiconductor components are fitted onto a carrier and are enclosed by a polyurethane layer. Afterward, the carrier is removed and conductors for the semiconductor components are fitted.

SUMMARY

Against this background, the present disclosure presents a method for constructing an electrical circuit comprising at least one semiconductor chip and an electrical circuit comprising at least one semiconductor chip in accordance with the independent patent claims. Advantageous configurations emerge from the respective dependent claims and the following description.

Features of the disclosure are based on the insight that production of a chip package in the wafer level process, so-called wafer level packaging, with the integration of an energy store, such as e.g. a thin-film battery, affords considerable advantages. The chip package can thus be extended by the additional function of an energy store in the form of a thin-film battery, for example, such that a wafer level package with a thin-film battery formed in an integrated fashion is produced.

During the wafer level process, chips are mounted on a temporary carrier substrate. Afterward, by means of a molding compound, a chip-molding compound wafer is produced, on which a new wiring level for electrical contact-connection is produced after the removal of the carrier substrate. The task of the wiring level is to spread the connection grid from very fine, as on the original silicon wafer, to coarser dimensions for linking to a printed circuit board, which cannot realize the fine structures on account of the production technology.

Thin-film batteries are suitable for integration with silicon semiconductor chips. It is possible to use, for example, thin-film batteries on the basis of a process from the Oak Ridge National Laboratory, Bates et al. (1995), 'Thin-film rechargeable lithium batteries', *J. Power Sources* 54, page 58. Such batteries comprising a solid electrolyte also withstand higher temperatures than traditional batteries comprising a liquid electrolyte.

The advantages of the disclosure are that the production process for the thin-film battery can be integrated directly into the wafer level package process flow. Moreover, as necessary, the package size, e.g. the lateral dimensions, can be extended cost-effectively if the silicon chip area present is not sufficient for the battery, or, on the other hand, the enlargement of the dimensions that is necessary anyway for accommodating the bonding pads can be utilized constructively. Subsequent integration of a battery into the finished circuit is not necessary. Consequently, energy-autonomous or energy-supported semiconductor or sensor modules can be produced cost-effectively and compactly.

The present disclosure provides a method for constructing an electrical circuit comprising at least one semiconductor chip encapsulated with a potting compound, comprising the following step:

applying a galvanic layer arrangement for forming an electrochemical element on an element of the electrical circuit having the at least one semiconductor chip.

An electrical circuit can be understood to be an integrated circuit having a plurality of electronic components. The electrical circuit can be provided in the form of a wafer level package. The semiconductor chip can be a semiconductor component, for example a silicon chip. In this case, the circuit can have one or a plurality of semiconductor chips. The semiconductor chip can be present in packaged or housed fashion and can be provided with contact connections. A galvanic layer arrangement can be understood to be a sequence of a plurality of thin films or layers. The galvanic layer arrangement functions as a galvanic cell for energy storage. By way of example, the galvanic layer arrangement can be a battery, and in particular a thin-film battery, a 2D battery or a 3D battery being conceivable. The galvanic layer arrangement can be formed by the plurality of thin layers being successively deposited or applied by sputtering, for example. In this case, it is not necessary for the galvanic layer arrangement to be applied in temporal succession. Instead, the electrochemical element can be applied in one step, that is to say simultaneously—as a "finished" battery. By way of example, the electrochemical element can be applied by lamination. The galvanic layer arrangement is formed on an element of the electrical circuit, to put it more precisely on a surface of an element of the electrical circuit. The element of the electrical circuit can be, for example, the at least one semiconductor chip, a wiring layer or a potting compound of the electrical circuit. In the finished circuit, the semiconductor chip is at least partly enclosed with the potting compound. By way of example, the semiconductor chip can be enclosed with the potting compound apart from a contact side. In accordance with one embodiment, the electrochemical element can already be situated on the chip before the chip is encapsulated. In accordance with a further embodiment, the electrochemical element is applied to a chip that has already been encapsulated.

In accordance with one embodiment, in the applying step, a plurality of thin layers can be applied temporally successively in order to form the galvanic layer arrangement. The thin layers can be, for example, thin electrode and solid electrolyte layers. This embodiment affords the advantage that the galvanic layer arrangement can be formed on different surfaces of different elements of the electrical circuit, without the basic design of the galvanic layer arrangement changing. Unlike a prefabricated battery, in the step of forming the galvanic layer arrangement, uncomplicated adaptation to respective conditions of the application surface can be effected.

The applying step can be carried out before, after or in parallel with a step of fitting the at least one semiconductor chip by a contact side thereof to a carrier substrate, a step of encapsulating the at least one semiconductor chip on the carrier substrate with a potting compound, a step of detaching the carrier substrate from the at least one semiconductor chip, wherein the contact side of the at least one semiconductor chip is uncovered, and/or a step of forming a wiring layer on a contact side of the at least one semiconductor chip. These steps are typically implemented in a wafer level package process. Fitting the at least one semiconductor chip by the contact side to a carrier substrate can be understood to mean, for example, adhesive bonding thereon by means of an adhesive, e.g. an adhesive film. In this case, the adhesive film may have been or be provided on the carrier substrate, and the at least one chip can then be placed thereon. The carrier substrate can have the form of a wafer, for example. In the process of detaching the carrier substrate from the at least one semiconductor chip, carrier substrate and adhesive from that of the carrier substrate are removed from the at least one semiconductor chip. The wiring layer is formed by means of known semiconductor technology methods such as e.g. metal sputtering, resist coating, lithography or electrodeposition. This affords the advantage that the process of forming the galvanic layer arrangement according to the disclosure can readily be incorporated into the wafer level package process sequence and can therefore be realized with minimal manufacturing outlay and flexibly in terms of the progression. Performing the forming step before, after or in parallel with one or more of the abovementioned steps depends on which element of the electrical circuit the galvanic layer arrangement is intended to be arranged on.

In accordance with one embodiment, the element can be a wiring layer of the electrical circuit, wherein, in the applying step, the galvanic layer arrangement is applied on a region of the wiring layer. The circuit can have a layer construction, wherein the wiring layer can be understood to be a wiring plane in the layer construction of the circuit. The wiring layer serves principally for providing contact lines for making contact with the semiconductor chip and for providing circuit-internal electrical connections between the electronic components of the circuit. The wiring layer can extend beyond an area of the contact side of the semiconductor chip. In this case, the galvanic layer arrangement can extend at least over part of the wiring layer. This embodiment affords the advantage that the galvanic layer arrangement can be applied or formed independently of a wiring geometry of the electrical circuit. In addition, however, the galvanic layer arrangement is also positioned in proximity to the wirings that are present anyway, which allows a short line length from/to the galvanic layer arrangement.

Moreover, the element can be a potting compound into which the at least one semiconductor chip is encapsulated, wherein, in the applying step, the galvanic layer arrangement is applied on a region of the potting compound. A potting compound can be a molding compound or mold compound. That region of the potting compound on which the plurality of thin layers are applied can be a rear-side surface of the potting compound. The rear-side surface of the potting compound is remote from the wiring layer. In this case, the plurality of thin layers for forming the galvanic layer arrangement can be applied to the rear-side surface of the potting compound. Moreover, the plurality of thin layers for forming the galvanic layer arrangement can be applied into a cutout or depression in the rear-side surface of the potting compound. This embodiment affords the advantage that the galvanic layer arrangement can be formed independently of a wiring geometry of the electrical circuit or without impairing the latter.

Furthermore, the element can be the at least one semiconductor chip, wherein, in the applying step, the galvanic layer arrangement is applied on a region of the at least one semiconductor chip. In this case, the plurality of thin layers can be applied at least on part of a surface of the at least one semiconductor chip. This affords the advantage that the galvanic layer arrangement is positioned in proximity to the semiconductor chip to be supplied with energy and also the wirings, which allows a short line length from/to the galvanic layer arrangement.

In this case, the at least one semiconductor chip can have a cutout on a contact side, wherein, in the applying step, the galvanic layer arrangement is applied in the cutout. The contact side of the semiconductor chip is the active side thereof, on which electrical contacts of the chip are also situated. If the semiconductor chip is encapsulated in a potting compound, then the contact side is not covered with potting compound. The cutout on the contact side can be arranged in such a way that contacts of the at least one semiconductor chip are not impaired. The semiconductor chip can be prefabricated with the cutout on the contact side. The cutout can extend over part of the contact side. This particular embodiment affords the advantage that no additional, separate layer is required for forming the plurality of thin layers of the energy store in the course of integrating the galvanic layer construction into the electrical circuit.

Moreover, in the applying step, the galvanic layer arrangement can be applied on at least part of a rear side of the at least one semiconductor chip. A rear side of the at least one semiconductor chip can be understood to be a surface remote from the contact side of the at least one semiconductor chip. In this case, the plurality of thin layers can be applied on part of the rear side of the at least one semiconductor chip or on the entire rear side. On the rear side there can also be a cutout or depression in which the galvanic layer arrangement can be applied. This further particular embodiment affords the advantage that the galvanic layer arrangement can be formed independently of a wiring geometry of the electrical circuit or without impairing the latter.

The present disclosure furthermore provides an electrical circuit comprising at least one semiconductor chip encapsulated with a potting compound, comprising the following feature:

a galvanic layer arrangement, which, for forming an electrochemical element, is applied on an element of the electrical circuit having the at least one semiconductor chip.

The galvanic layer arrangement can function as a device for storing energy and supply the circuit with a supply voltage, a stable reference voltage or a short bridging voltage.

The present disclosure furthermore provides a sensor module comprising an electrical circuit according to the disclosure.

A sensor module can be understood to be, for example, a pressure sensor, inertial sensor, magnetic sensor with evaluation IC or the like. The electrical circuit according to the disclosure can advantageously be used in the sensor module. Consequently, the wafer level package process according to the disclosure with integration of an energy store can be utilized for sensor modules. One possibility for using sensors resides in RFID tags, for example. Consequently, a sensor module, e.g. a pressure sensor, can be energy-autonomous or energy-supported.

BRIEF DESCRIPTION OF THE DRAWINGS

Features of the disclosure are explained in greater detail by way of example below with reference to the accompanying drawings, in which:

FIGS. 1 to 7 show illustrations of an electrical circuit in the production process in accordance with exemplary embodiments of the present disclosure; and FIGS. 8 to 11 show flowcharts of a method in accordance with an exemplary embodiments of the present disclosure.

DETAILED DESCRIPTION

Figure 3:
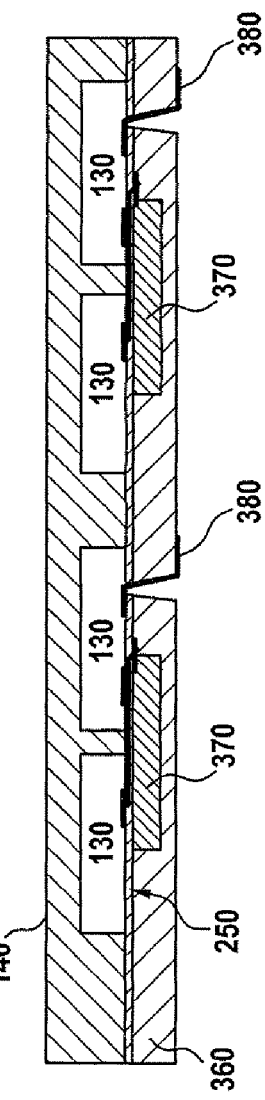

In the following description of preferred exemplary embodiments of the present disclosure, identical or similar reference symbols are used for the elements which are illustrated in the different figures and act similarly, a repeated description of these elements being dispensed with.

FIG. 1 shows a sectional view of a layer construction of an electrical circuit in the production process, in accordance with an exemplary embodiment of the present disclosure. In this case, the circuit is produced by means of a method in accordance with an exemplary embodiment of the present disclosure. The layer construction comprises a carrier substrate 110, an adhesive in the form of an adhesive film 120, semiconductor chips 130 and a molding or potting compound 140. The method is based on a wafer level package process. Fixing of the chips 130 by means of the adhesive film 120 on the carrier substrate 110 and subsequent overmolding or encapsulation are effected in this case.

A thin layer of the adhesive film 120 is situated at the top side of the carrier substrate 110. The semiconductor chips 130 are adhesively bonded adjacent to one another on a surface of the adhesive film 120. The semiconductor chips 130 can be arranged in one or a plurality of rows or some other pattern on the adhesive film 120. The adhesively bonded semiconductor chips 130 are encapsulated in the potting compound 140. Only a cross section through a layer construction of part of a wafer is illustrated in the sectional view in FIG. 1, for the sake of clarity and expediency. The structures shown can be repeated on the entire wafer in the manner shown.

The carrier substrate 110 consists of a material suitable for the process, for example a wafer or a metal plate. The carrier substrate can be produced here from a suitable material known in the field. Of course, a combination of suitable materials can also be involved in this case. The carrier substrate 110 has two main surfaces.

The adhesive film 120 is applied in a thin layer to one of the two main surfaces of the carrier substrate 110, the upper main surface in FIG. 1. The adhesive film 120 covers the entire main surface of the carrier substrate 110 shown in FIG. 1. The adhesive film 120 can be produced from a suitable adhesive material known in the field. Of course, a combination of suitable materials can also be involved in this case.

The semiconductor chips 130 are each fixed to the adhesive film 120 at one of their main surfaces. The semiconductor chips 130 are identical or different integrated circuits or a micro- or nanostructured component based on a semiconductor substrate, for example silicon. FIG. 1 shows four semiconductor chips 130 by way of example. The semiconductor chips 130 will hereinafter be designated as chip A, chip B, chip C and chip D from left to right in FIG. 1, for the purpose of better clarity. Chips A and B are assigned to a first electrical circuit, and chips C and D are assigned to a second electrical circuit. The lateral distance between chip A and chip B, and also between chip C and chip D, is smaller than the lateral distance between chip B and chip C, having approximately half the magnitude thereof in FIG. 1. Connection pads of the semiconductor chips 130 are situated at the lower side, by which the semiconductor chips 130 are adhesively bonded onto the adhesive film 120. In this case, the lower side of the semiconductor chips 130 is the active side or contact side of the semiconductor chips 130. The connection pads or electrical contacts of the semiconductor chips 130 are illustrated as flat rectangles at the lower ends of the chips in FIG. 1. In FIG. 1, chip A and chip C each have one connection pad, and chip B and chip D each have two connection pads. The semiconductor chips 130 can have further connection pads situated in front of or behind the sectional plane chosen in FIG. 1.

The molding or potting compound 140 (also known as mold compound) can be produced from a suitable material known in the field. Of course, a combination of suitable materials can also be involved in this case. In FIG. 1, the potting compound 140 is arranged on the semiconductor chips 130 as a covering layer that is planar toward the top. The potting compound 140 surrounds and covers the semiconductor chips 130 at all sides apart from that by which the semiconductor chips 130 are fixed to the adhesive film 120. The potting compound 140 forms a continuous layer around all the semiconductor chips 130 arranged on the adhesive film 120 and on said semiconductor chips. In regions of the adhesive film 120 at which no semiconductor chip 130 is adhesively bonded thereon, the potting compound 140 is in contact with the adhesive film 120. As is shown in FIG. 1, the active sides of the semiconductor chips 130 and the potting compound 140 terminate flush with the adhesive film 120 on one plane.

Consequently, the layer construction shown in FIG. 1 can be produced by means of the wafer level package process by virtue of the semiconductor chips 130 that are to be packaged being fixed with the active side downward by means of a suitable material, preferably an adhesive film 120, onto the carrier substrate 110. The semiconductor chips 130 are then overmolded or encapsulated with the potting compound 140 by means of a suitable molding method; by way of example, film molding is expedient.

FIG. 2 shows a sectional view of a layer construction of an electrical circuit in the production process, in accordance with an exemplary embodiment of the present disclosure. In this case, the circuit is produced by means of a method in accordance with an exemplary embodiment of the present disclosure. The method is based on a wafer level package process. The layer construction illustrated in FIG. 2 is similar to that shown in FIG. 1, with the difference that the adhesive film 120 and the carrier substrate 110 have been removed and a wiring layer 250 is arranged at the then exposed surface of the semiconductor chips 130 and the potting compound 140 by means of semiconductor technology, for example resist coating, metal sputtering, lithography, etc.

The wiring plane or wiring layer 250 covers the active sides of the semiconductor chips 130 and the lower surface of the potting compound 140. Conductive connections for wiring the semiconductor chips among one another and externally (the latter are not illustrated in FIG. 2) are formed on a surface of the wiring layer 250 that faces the semiconductor chips 130. FIG. 2 illustrates two conductive connections or conductor tracks of chips for interconnecting the latter by means of flat rectangles in the first wiring layer 250. The connections shown in FIG. 2 run between the connection pad of chip A and a connection pad of chip B and between the connection pad of chip C and a connection pad of chip D. There is no conductive connection between chip B and chip C, since these chips are each assigned to different electrical circuits which are separated subsequently. In FIG. 2, the wiring layer 250 has approximately the thickness of the adhesive film 120 from FIG. 1.

In order to arrive at the layer construction shown in FIG. 2 proceeding from the layer construction shown in FIG. 1, further steps of a wafer level package process are performed. Proceeding from the state in FIG. 1, the adhesive film 120 and the carrier substrate 110 are detached from the semiconductor chips 130 and the molding or potting compound 140. A type of chip-molding compound composite wafer is thus obtained. On account of the wafer form, this composite wafer can then be processed further in known installations appertaining to semiconductor technology. After the removal of the film 120 and the carrier substrate 110, the wiring plane 250 is produced with the aid of a semiconductor technology, such as resist coating, metal sputtering, lithography, etc. By means of semiconductor technology methods such as, for example, metal sputtering, lithography or electrodeposition, the electrical wiring of the semiconductor chip 130, or of a plurality of chips in the case of different semiconductor chips in one package, is realized.

FIG. 3 shows a sectional view of a layer construction of an electrical circuit in the production process, in accordance with an exemplary embodiment of the present disclosure. In this case, the circuit is produced by means of a method in accordance with an exemplary embodiment of the present disclosure. The layer construction illustrated in FIG. 3 is similar to that shown in FIG. 2, with the difference that a battery layer 360 is applied on the wiring layer 250. The layer thicknesses shown in the figures have been chosen thus only for reasons of clarity. The real layer thicknesses can deviate from the layer thicknesses shown.

In accordance with the sectional view in FIG. 3, the battery layer 360 has two galvanic layer arrangements 370 in the form of thin-film batteries for forming a respective energy store and two contact pads or contact connection pads 380 for external connections. Consequently, two batteries 370 are integrated into the battery layer 360. The number of contact connection pads of the entire electrical circuit can deviate from the two shown in the sectional view, and can be significantly higher, for example. A connection pad of chips B and D is electrically conductively connected to one of the contact connection pads 380 in each case via a plated-through hole through the wiring layer 250 and the battery layer 360. In FIG. 3, the thickness of the battery layer 360 is approximately six times that of the wiring layer 250. In this case, the wiring layer 250 is arranged between the semiconductor chips 130 or the potting compound 140 and the battery layer 360. The galvanic layer arrangements 370 terminate flush with a surface of the battery layer 360 that faces the wiring layer 250 and extend in FIG. 3 in terms of thickness through approximately three quarters of the layer thickness of the battery layer 360. The contact connection pads 380 are arranged on a surface of the battery layer 360 that is remote from the wiring layer 250.

A first of the galvanic layer arrangements 370 extends over an interspace and over edge regions of the adjacent chips A and B. A second of the galvanic layer arrangements 370 extends over an interspace and over edge regions of the adjacent chips C and D. The first of the galvanic layer arrangements is electrically conductively connected to a conductor track on the top side of the wiring layer 250 via a conductor track arranged on the underside of the wiring layer 250 or the top side of the battery layer 360 and a plated-through hole. A connection pad of chips B and D is electrically conductively connected to one of the contact connection pads 380 in each case via a plated-through hole through the layers 250, 360.

In order to arrive at the layer construction shown in FIG. 3 preceding from the layer construction shown in FIG. 2, in one step of the wafer level package process, the battery layer 360 together with the galvanic layer arrangements 370 arranged in the battery layer 360 are realized by means of semiconductor technology methods such as metal sputtering, lithography or electrodeposition. In this case, firstly the galvanic layer arrangements 370 can be applied to the wiring layer 250 and subsequently be surrounded by a base material of the battery layer 360. Alternatively, firstly part of the base material of the battery layer 360 can be applied to the wiring layer 250, then the galvanic layer arrangements 370 can be applied in cutouts of the base material and, finally, further base material of the battery layer 360 can be applied, in order to cover the galvanic layer arrangements 370. Consequently, one or a plurality of galvanic layer arrangements 370 are additionally realized on or in the battery layer 360 by means of processes such as sputtering or deposition, for example. In parallel with applying the battery 370 or beforehand or after the deposition of the battery, by means of semiconductor technology methods such as metal sputtering, lithography or electrodeposition, an electrical wiring of the silicon chip or a plurality of chips in the case of different silicon chips in one package, and contact pads for making contact with the package are realized.

The integration of the galvanic layer arrangement 370 or thin-film battery is effected in this exemplary embodiment according to the disclosure after the production of the chip-molding compound composite wafer from FIG. 2 on the active side of the composite wafer. The layer systems 370 for the battery are applied to the composite wafer by means of suitable methods adapted to the temperature resistance of the molding compound 140.

By means of simple methods such as applying 2D layers by sputtering, for example, 2D batteries can thus be realized, which can supply a low capacitance, e.g. for a stable reference voltage or short bridging voltages. Further possible methods are e.g. depositions by means of suitable precursors e.g. from the gas phase or so-called "atomic layer deposition" (ALD), which deposits monolayer by monolayer and in the process attains a very good layer quality and also a high conformity of the deposition.

It is also possible to realize a 3-dimensional battery, which, for the same area requirement, allows significantly higher capacitances and thus e.g. autonomous operation of the systems thus produced over a longer period of time. In this exemplary embodiment of the disclosure, this takes place on the active front side of the wafer by virtue of a suitable material, e.g. benzocyclobutene (BCB), having a higher layer thickness being applied and structured. In a further embodiment, the semiconductor chip can also be prestructured by means of suitable methods such as e.g. DRIE/trenching. The battery layer system is subsequently applied by means of a suitable method which allows deposition with sufficient layer thickness and conformity on the structured substrate.

A wafer level package in accordance with an exemplary embodiment of the disclosure with an integrated thin-film battery (2D or 3D) on the front side is thus obtained.

Figure 4:
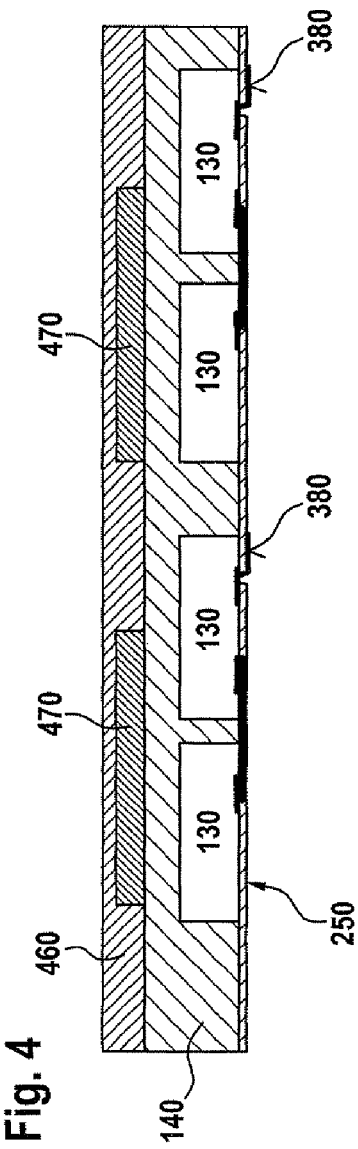

FIG. 4 shows a sectional view of a layer construction of an electrical circuit in the production process, in accordance with an exemplary embodiment of the present disclosure. In this case, the circuit is produced by means of a method in accordance with an exemplary embodiment of the present disclosure. The layer construction illustrated in FIG. 4 is similar to that shown in FIG. 2 with the difference that a battery layer 460 with galvanic layer arrangements 470 is applied on a surface of the potting compound 140 that is remote from the wiring layer 250. Furthermore, in a manner deviating from FIGS. 2 and 3, contact connection pads 380 are formed in and on the wiring layer 250. The contact-connection (not illustrated in FIG. 4) of the galvanic layer arrangement to the semiconductor chip or to the wiring plane can preferably be effected by means of conductive through-contacts in the potting compound. Two contact pads or contact connection pads 380 for external connections are arranged on a surface of the wiring layer 250 that is remote from the contact sides of the semiconductor chips 130 in accordance with the sectional view in FIG. 4. The number of contact connection pads of the entire electrical circuit can, of course, deviate from the two shown in the sectional view and can be significantly higher. A connection pad of chips B and D is electrically conductively connected to one of the contact connection pads 380 in each case via a plated-through hole through the wiring layer 250.

In FIG. 4, the battery layer 460 has two galvanic layer arrangements 470 in the form of thin-film batteries for forming a respective energy store. In FIG. 4, the thickness of the battery layer 460 is approximately four times that of the wiring layer 250. The galvanic layer arrangements 470 terminate flush with a surface of the battery layer 460 that faces the potting compound 140. In FIG. 4, the galvanic layer arrangements 470 extend in terms of thickness through approximately three quarters of the layer thickness of the battery layer 460.

A first of the galvanic layer arrangements 470 extends over an interspace and at least over edge regions of the adjacent chips A and B. In FIG. 4, a majority proportion of the first of the galvanic layer arrangements 470 extends above chip A. A second of the galvanic layer arrangements 470 extends over an interspace and at least over edge regions of the adjacent chips C and D. In FIG. 4, a majority proportion of the second of the galvanic layer arrangements 470 extends above chip C. Electrically conductive connections of the galvanic layer arrangements 470 to the rest of the electrical circuit or the rest of the package or composite wafer are not shown in FIG. 4, for the sake of simplicity, but are realized in a real electrical circuit, of course, as is evident to a person skilled in the relevant art.

In order to arrive at the layer construction shown in FIG. 4 proceeding from the layer construction shown in FIG. 2, in one step of the wafer level package process, the contact pads 380 are realized on the wiring layer 250 for making contact with the package by means of semiconductor technology methods such as metal sputtering, lithography or electrodeposition. In accordance with this exemplary embodiment, one or more galvanic layer arrangements 470 are additionally realized on or in the battery layer 460 by means of processes such as sputtering or deposition, for example. The electrical wiring of the silicon chip or of a plurality of chips in the case of different silicon chips in one package, and the contact pads for making contact with the package by means of semiconductor technology methods (metal sputtering, lithography, electrodeposition), are realized in parallel with the application of the battery or beforehand or after the deposition of the battery.

The integration of the galvanic layer arrangement 470 or thin-film battery is effected in this exemplary embodiment according to the disclosure after the production of the chip-molding compound composite wafer from FIG. 2 on the rear side of the composite wafer, lying opposite the wiring layer 250. The layer systems 470 for the battery are applied to the composite wafer by means of suitable methods adapted to the temperature resistance of the molding compound 140.

By means of simple methods such as applying 2D layers by sputtering, for example, 2D batteries can thus be realized, which can supply a low capacitance, e.g. for a stable reference voltage or short bridging voltages. Further possible methods are e.g. depositions by means of suitable precursors e.g. from the gas phase or so-called "atomic layer deposition" (ALD), which deposits monolayer by monolayer and in the process attains a very good layer quality and also a high conformity of the deposition.

It is also possible to realize a 3-dimensional battery, which, for the same area requirement, allows significantly higher capacitances and thus e.g. autonomous operation of the systems thus produced over a longer period of time. In this exemplary embodiment of the disclosure, this takes place on the rear side of the wafer by virtue of a suitable material, e.g. benzocyclobutene (BCB), having a higher layer thickness being applied and structured. In a further embodiment, the semiconductor chip can also be prestructured by means of suitable methods such as e.g. DRIE/trenching. The battery layer system is subsequently applied by means of a suitable method which allows deposition with sufficient layer thickness and conformity on the structured substrate.

A wafer level package in accordance with an exemplary embodiment of the disclosure with an integrated thin-film battery (2D or 3D) on the rear side is thus obtained.

Figure 5:
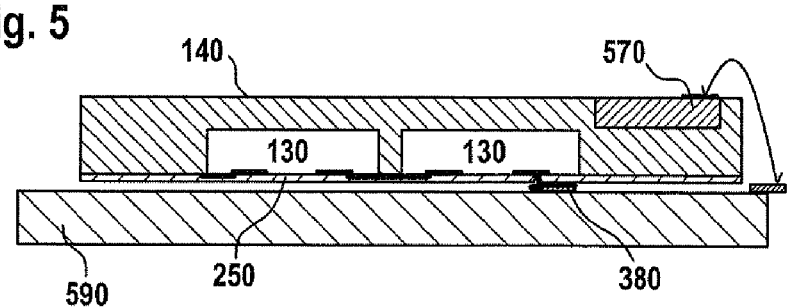

FIG. 5 shows a sectional view of a layer construction of an electrical circuit in the production process, in accordance with an exemplary embodiment of the present disclosure. In this case, the circuit is produced by means of a method in accordance with an exemplary embodiment of the present disclosure. The layer construction illustrated in FIG. 5 is similar to that shown in FIG. 2, with the main difference that a galvanic layer arrangement 570 is applied in a surface of the potting compound 140 that is remote from the wiring layer 250. The sectional view shown in FIG. 5 merely illustrates an excerpt from a composite wafer with a single electrical circuit in the production process, said electrical circuit having, for example, either chip A and chip B or chip C and chip D.

Furthermore, in the exemplary embodiment of the disclosure as shown in FIG. 5, in a manner similar to that from FIG. 4, a contact connection pad 380 is formed in and on the wiring layer 250. The galvanic layer arrangement 570 is applied in a cutout or depression formed in a surface of the potting compound 140 that is remote from the wiring layer 250, at the rear side of the composite wafer from FIG. 2. The cutout, in which the galvanic layer arrangement 570 is formed, extends in an edge region of the rear side of the composite wafer in the potting compound 140. In the sectional view from FIG. 5, the cutout with the galvanic layer arrangement 570 is arranged such that it does not overlap any of the semiconductor chips 130. The thickness of the galvanic layer arrangement 570 is approximately five times the thickness of the wiring layer 250. The thickness of the galvanic layer arrangement 570 corresponds to a depth of the cutout. Consequently, the galvanic layer arrangement 570 terminates flush with the potting compound on the rear side of the composite wafer.

In accordance with this exemplary embodiment, the package is contact-connected to a superordinate printed circuit board 590 by means of soldering contacts, and the battery is contact-connected by means of a wire bond. A further possibility (not illustrated), would be for the battery to be contact-connected to the wiring plane 250 by means of through-plating in the molding compound.

In order to arrive at the layer construction shown in FIG. 5 proceeding from the layer construction shown in FIG. 2, a cutout, if not already present, is formed in the potting compound 140. The galvanic layer arrangement 570 is applied in the cutout by means of suitable processes such as sputtering or deposition, for example. Furthermore, the contact pad 380 and the connection pad for the bonding wire for making contact with the galvanic layer arrangement 570 are formed.

The integration of the galvanic layer arrangement 570 or thin-film battery is effected in this exemplary embodiment according to the disclosure after the production of the chip-molding compound composite wafer from FIG. 2 on the rear side of the composite wafer, lying opposite the wiring layer 250. The layer systems 570 for the battery are applied into the cutout in the rear side of the potting compound 140 by means of suitable methods adapted to the temperature resistance of the molding compound 140.

By means of a suitable method during the production of the wafer composite, e.g. impressing a structured mold tool, a structured rear side can be produced or the planar molding compound 140 on the rear side of the composite wafer is structured by means of suitable structuring methods or targeted etching of the molding compound 140. The battery layer system 570 is subsequently applied by means of a suitable method. In this case, too, the temperature restrictions of the molding compound 140 should be taken into consideration. If appropriate, however, it is possible to use e.g. a plastic that deviates from the standard and has a higher softening temperature.

In accordance with one exemplary embodiment, in the arrangement shown in FIG. 5, a 3D battery can be applied into the rear side of the composite wafer. This gives rise to a wafer level package in accordance with an exemplary embodiment of the disclosure with a package-integrated thin-film battery (3D) in the rear side.

Figure 6:
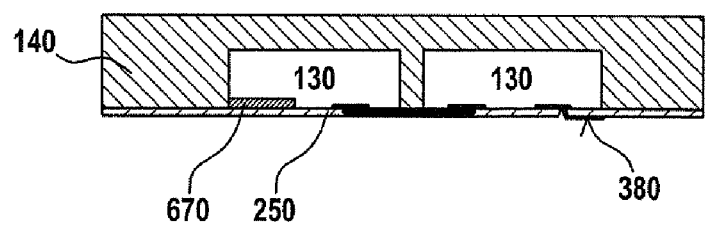

FIG. 6 shows a sectional view of a layer construction of an electrical circuit in the production process, in accordance with an exemplary embodiment of the present disclosure. In this case, the circuit is produced by means of a method in accordance with an exemplary embodiment of the present disclosure. The layer construction illustrated in FIG. 6 is similar to that shown in FIG. 2, with the main difference that a galvanic layer arrangement 670 is applied in a cutout of a contact side of a semiconductor chip 130. The sectional view shown in FIG. 6 merely illustrates a single electrical circuit in the production process, said electrical circuit having, for example, either chip A and chip B or chip C and chip D. The cutout is formed in the contact side of chip A or chip C, respectively.

Furthermore, in the exemplary embodiment of the disclosure as shown in FIG. 6, in a manner similar to that from FIG. 4 and FIG. 5, a contact connection pad 380 is formed in and on the wiring layer 250.

The galvanic layer arrangement 670 is applied in a cutout on a surface of the semiconductor chip 130 that faces the wiring layer 250, at the active side or contact side of the semiconductor chip 130. In the sectional view in FIG. 6, the cutout in the contact side of the semiconductor chip 130 extends from a left-hand edge approximately to the center of the contact side of the semiconductor chip 130. However, an extent of the cutout can deviate from that shown in FIG. 6 and can be smaller or larger, for example. A thickness of the galvanic layer arrangement 670 corresponds approximately to the thickness of the wiring layer 250. The thickness of the galvanic layer arrangement 670 corresponds to a depth of the cutout. Consequently, the galvanic layer arrangement 670 terminates flush with the contact side of the semiconductor chip 130.

In order to obtain the layer construction shown in FIG. 6, firstly by means of processes such as sputtering or deposition, for example, the galvanic layer arrangement 670 is applied in the cutout on the contact side or front side or active side of a semiconductor chip 130. The semiconductor chip 130 with the integrated thin-film battery 670 is then packaged in the context of the wafer level packaging process flow described in FIG. 1 and FIG. 2. Furthermore, in one step of the wafer level package process, by means of semiconductor technology methods such as metal sputtering, lithography or electrodeposition, the contact pads 380 for making contact with the package are realized on the wiring layer 250.

Consequently, a wafer level package in accordance with an exemplary embodiment of the disclosure is obtained, wherein firstly the thin-film battery is integrated onto the front side (active side) of the chip. A chip-integrated battery is therefore formed by integration on the chip front side or the active front side of the silicon wafer.

Figure 7:
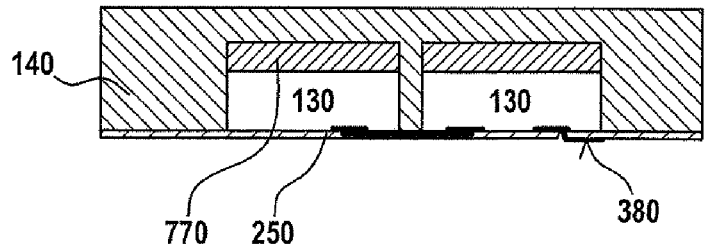

FIG. 7 shows a sectional view of a layer construction of an electrical circuit in the production process, in accordance with an exemplary embodiment of the present disclosure. In this case, the circuit is produced by means of a method in accordance with an exemplary embodiment of the present disclosure. The layer construction illustrated in FIG. 7 is similar to that shown in FIG. 2, with the main difference that a galvanic layer arrangement 770 is in each case applied on a rear side of a semiconductor chip 130, lying opposite the contact side of the semiconductor chip 130. The sectional view shown in FIG. 7 merely illustrates a single electrical circuit in the production process, said electrical circuit having, for example, either chip A and chip B or chip C and chip D.

Furthermore, in the exemplary embodiment of the disclosure as shown in FIG. 7, in a manner similar to that from FIG. 4 to FIG. 6, a contact connection pad 380 is formed in and on the wiring layer 250.

The galvanic layer arrangement 770 is applied on a surface of the semiconductor chip 130 that is remote from the wiring layer 250 and lies opposite the contact side, at the rear side of the semiconductor chip 130. In the sectional view in FIG. 7, the galvanic layer arrangement 770 at the rear side of the semiconductor chip 130 extends over the entire rear side, that is to say the entire surface, of the semiconductor chip 130. However, an extent of the galvanic layer arrangement 770 can deviate from that in FIG. 7.

In order to obtain the layer construction shown in FIG. 7, firstly by means of processes such as sputtering or deposition, for example, the galvanic layer arrangement 770 is applied on the rear side of a semiconductor chip 130. The semiconductor chip 130 with the integrated thin-film battery 770 is then packaged in the context of the wafer level packaging process flow described in FIG. 1 and FIG. 2. The contact-connection (not illustrated in FIG. 7) of the galvanic layer arrangement to the semiconductor chip can preferably be effected by means of conductive through contacts in the semiconductor chip from the rear side to the contact front side. Furthermore, in one step of the wafer level package process, by means of semiconductor technology methods such as metal sputtering, lithography or electrodeposition, the contact pads 380 for making contact with the package are realized on the wiring layer 250.

Consequently, a wafer level package in accordance with an exemplary embodiment of the disclosure is obtained, wherein the thin-film battery is integrated beforehand onto the rear side of the silicon wafer/chip. A chip-integrated battery is therefore formed by integration on the chip rear side or the unused rear side of the silicon wafer.

FIG. 8 shows a flowchart of a method for constructing an electrical circuit comprising at least one semiconductor chip, in accordance with an exemplary embodiment of the present disclosure. In a step 805, a galvanic layer arrangement composed of a plurality of thin layers is applied temporally successively on a cutout of a contact side of at least one semiconductor chip. In a step 810, the at least one semiconductor chip is fitted by the contact side to a carrier substrate. In a step 820, the at least one semiconductor chip on the carrier substrate is encapsulated with a potting compound. In a step 830, the carrier substrate is detached from the at least one semiconductor chip, wherein the contact side of the at least one semiconductor chip is exposed. Consequently, a semiconductor chip-potting compound composite wafer is then provided, to which a wiring layer can be applied by means of known methods.

FIG. 9 shows a flowchart of a method for constructing an electrical circuit comprising at least one semiconductor chip, in accordance with a further exemplary embodiment of the present disclosure. In a step 915, the galvanic layer arrangement composed of the plurality of thin layers is applied simultaneously or temporally successively on a rear side of the at least one semiconductor chip, said rear side lying opposite the contact side. This is preferably done with the semiconductor chips still in the wafer composite assembly. In a step 810, the at least one semiconductor chip is then fitted by a contact side to a carrier substrate. In a step 820, the at least one semiconductor chip together with the plurality of thin layers and the carrier substrate is encapsulated with a potting compound. In a step 830, the carrier substrate is detached from the at least one semiconductor chip, wherein the contact side of the at least one semiconductor chip is exposed. Consequently, a semiconductor chip-potting compound composite wafer is then provided, to which a wiring layer can be applied by means of known methods. Consequently, in accordance with this exemplary embodiment the battery will firstly be applied to the chip rear side before the chips are encapsulated.

FIG. 10 shows a flowchart of a method for constructing an electrical circuit comprising at least one semiconductor chip, in accordance with a further exemplary embodiment of the present disclosure. In a step 810, the at least one semiconductor chip is fitted by a contact side to a carrier substrate. In a step 820, the at least one semiconductor chip on the carrier substrate is encapsulated with a potting compound. In a step 1025, the galvanic layer arrangement composed of the plurality of thin layers is applied temporally successively on the potting compound. In a step 830, the carrier substrate is detached from the at least one semiconductor chip, wherein the contact side of the at least one semiconductor chip is exposed. Steps 830 and 1025 can also be performed in the opposite order. Consequently, a semiconductor chip-potting compound composite wafer is then provided, to which a wiring layer can be applied by means of known methods.

FIG. 11 shows a flowchart of a method for constructing an electrical circuit comprising at least one semiconductor chip, in accordance with a further exemplary embodiment of the present disclosure. In a step 810, the at least one semiconductor chip is fitted by a contact side to a carrier substrate. In a step 820, the at least one semiconductor chip on the carrier substrate is encapsulated with a potting compound. In a step 830, the carrier substrate is detached from the at least one semiconductor chip, wherein the contact side of the at least one semiconductor chip is exposed. Consequently, at least one semiconductor chip which is encapsulated with a potting compound apart from the contact area is then provided. In a step 1140, by means of a semiconductor technology method such as, for example, metal sputtering, resist coating, lithography or electrodeposition, a wiring layer is formed at a contact side of the at least one semiconductor chip. In a step 1145, the galvanic layer arrangement composed of the plurality of thin layers is applied temporally successively on the wiring layer.

Afterward, the composite wafers can each be singulated. In each case in parallel with the application of the battery or beforehand or after the deposition of the battery, an electrical wiring of the silicon chip or of a plurality of chips in the case of different silicon chips in one package, and contact pads for making contact with the package are realized by means of semiconductor technology methods such as metal sputtering, lithography or electrodeposition.

As an alternative to temporally successively applying the individual layers of the electrochemical element, as described on the basis of the preceding exemplary embodiments, it is also possible to apply a prefabricated electrochemical element as one unit. This procedure can be employed, in particular, in the exemplary embodiments described with reference to FIGS. 3 and 4.

The exemplary embodiments described and shown in the figures have been chosen merely by way of example. Different exemplary embodiments can be combined with one another completely or with regard to individual features. Moreover, one exemplary embodiment can be supplemented by features of a further exemplary embodiment. Depending on what preprocessing has already been effected or what postprocessing will also be effected, the method for producing an electrical circuit can also comprise only one or individual method steps from among the method steps described with reference to the figures.

What is claimed is:

1. A method for constructing an electrical circuit comprising at least one semiconductor chip encapsulated with a potting compound, comprising:
applying a galvanic layer arrangement for forming an electrochemical element on an element of the electrical circuit having the at least one semiconductor chip;
wherein the applying step is carried out before, after or in parallel with a step of fitting the at least one semiconductor chip by a contact side thereof to a carrier substrate, a step of encapsulating the at least one semiconductor chip on the carrier substrate with a potting compound, a step of detaching the carrier substrate from the at least one semiconductor chip, wherein the contact side of the at least one semiconductor chip is uncovered, and/or a step of forming a wiring layer on a contact side of the at least one semiconductor chip.

2. The method according to claim 1, wherein, in the applying step, a plurality of thin layers are applied temporally successively in order to form the galvanic layer arrangement.

3. The method according to claim 1, wherein the element is a wiring layer of the electrical circuit, wherein, in the applying step, the galvanic layer arrangement is applied on a region of the wiring layer.

4. The method according to claim 1, wherein the element is the potting compound into which the at least one semiconductor chip is encapsulated, wherein, in the applying step, the galvanic layer arrangement is applied on a region of the potting compound.

5. The method according to claim 1, wherein the element is the at least one semiconductor chip, wherein, in the applying step, the galvanic layer arrangement is applied on a region of the at least one semiconductor chip.

6. The method according to claim 5, wherein the at least one semiconductor chip has a cutout on the contact side, wherein, in the applying step, the galvanic layer arrangement is applied in the cutout.

7. The method according to claim 5, wherein, in the applying step, the galvanic layer arrangement is applied on at least part of a rear side of the at least one semiconductor chip.

8. A method for constructing a sensor module having an electrical circuit that includes at least one semiconductor chip encapsulated with a potting compound, comprising:
applying a galvanic layer arrangement for forming an electrochemical element on an element of the electrical circuit having the at least one semiconductor chip;

wherein the applying step is carried out before, after or in parallel with a step of fitting the at least one semiconductor chip by a contact side thereof to a carrier substrate, a step of encapsulating the at least one semiconductor chip on the carrier substrate with a potting compound, a step of detaching the carrier substrate from the at least one semiconductor chip, wherein the contact side of the at least one semiconductor chip is uncovered, and/or a step of forming a wiring layer on a contact side of the at least one semiconductor chip.

9. The method according to claim 8, wherein, in the applying step, a plurality of thin layers are applied temporally successively in order to form the galvanic layer arrangement.

10. The method according to claim 8, wherein the element is a wiring layer of the electrical circuit, wherein, in the applying step, the galvanic layer arrangement is applied on a region of the wiring layer.

11. A method for constructing an electrical circuit having a wiring layer and at least one semiconductor chip encapsulated with a potting compound, comprising:

applying a galvanic layer arrangement for forming an electrochemical element on a region of the wiring layer of the electrical circuit having the at least one semiconductor chip;

wherein the applying step is carried out before, after or in parallel with a step of fitting the at least one semiconductor chip by a contact side thereof to a carrier substrate, a step of encapsulating the at least one semiconductor chip on the carrier substrate with a potting compound, a step of detaching the carrier substrate from the at least one semiconductor chip, wherein the contact side of the at least one semiconductor chip is uncovered, and/or a step of forming a wiring layer on a contact side of the at least one semiconductor chip.

12. The method according to claim 11, wherein, in the applying step, a plurality of thin layers are applied temporally successively in order to form the galvanic layer arrangement.

13. The method according to claim 11, wherein the at least one semiconductor chip has a cutout on a contact side, wherein, in the applying step, the galvanic layer arrangement is applied in the cutout.

* * * * *